US009612402B2

(12) United States Patent
Fattal et al.

(10) Patent No.: US 9,612,402 B2
(45) Date of Patent: Apr. 4, 2017

(54) INTEGRATED SUB-WAVELENGTH GRATING SYSTEM

(75) Inventors: David A. Fattal, Mountain View, CA (US); Raymond G. Beausoleil, Redmond, WA (US); Marco Fiorentino, Mountain View, CA (US); Paul Kessler Rosenberg, Sunnyvale, CA (US); Terrel Morris, Garland, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 194 days.

(21) Appl. No.: 14/364,702

(22) PCT Filed: Jan. 12, 2012

(86) PCT No.: PCT/US2012/021066
§ 371 (c)(1),
(2), (4) Date: Jun. 12, 2014

(87) PCT Pub. No.: WO2013/105959
PCT Pub. Date: Jul. 18, 2013

(65) Prior Publication Data
US 2015/0010271 A1    Jan. 8, 2015

(51) Int. Cl.
*G02B 6/34*    (2006.01)
*H01S 5/40*    (2006.01)
(Continued)

(52) U.S. Cl.
CPC .................. *G02B 6/34* (2013.01); *G02B 6/12* (2013.01); *G02B 6/13* (2013.01); *G02B 6/4215* (2013.01);
(Continued)

(58) Field of Classification Search
None
See application file for complete search history.

(56) References Cited

U.S. PATENT DOCUMENTS 4,944,664 A * 7/1990 Allred ..................... E04G 11/34
192/85.49
4,994,664 A * 2/1991 Veldkamp ............ G02B 3/0056
250/208.2
(Continued)

FOREIGN PATENT DOCUMENTS

CN    1479878 A    2/2005
CN    1576907 A    2/2005
(Continued)

OTHER PUBLICATIONS

International Preliminary Report on Patentability received in PCT Application No. PCT/US2012/021066, Jul. 24, 2014, 6 pages.
(Continued)

*Primary Examiner* — Michelle R Connelly
(74) *Attorney, Agent, or Firm* — Fabian VanCott

(57) ABSTRACT

An integrated grating element system includes a first transparent layer formed on an optoelectronic substrate layer which includes at least two optoelectronic components, a first grating layer disposed on the first transparent layer which includes at least two sub-wavelength grating elements formed therein aligned with active regions of the optoelectronic components, and a second grating layer placed at a distance from the first grating layer such that light propagates between a diffraction grating element formed within the second grating layer and the at least two sub-wavelength grating elements.

15 Claims, 7 Drawing Sheets

(51) Int. Cl.
*H01S 5/42* (2006.01)
*G02B 6/42* (2006.01)
*H01L 31/0232* (2014.01)
*G02B 6/12* (2006.01)
*G02B 6/13* (2006.01)
*H01S 5/183* (2006.01)
*H01S 5/00* (2006.01)
*G02B 6/293* (2006.01)

(52) U.S. Cl.
CPC .... *H01L 31/0232* (2013.01); *H01L 31/02327* (2013.01); *H01S 5/183* (2013.01); *H01S 5/4012* (2013.01); *H01S 5/423* (2013.01); *G02B 6/2938* (2013.01); *G02B 6/29307* (2013.01); *G02B 6/29308* (2013.01); *G02B 6/29311* (2013.01); *G02B 2006/12166* (2013.01); *H01S 5/0071* (2013.01)

(56) References Cited

U.S. PATENT DOCUMENTS

| | | | |
|---|---|---|---|
| 5,061,027 A | 10/1991 | Richard | |
| 5,450,512 A | 9/1995 | Asakura | |
| 5,731,874 A * | 3/1998 | Maluf | G01J 3/02 257/E27.129 |
| 6,718,093 B2 * | 4/2004 | Zhou | G02B 6/12002 385/14 |
| 6,856,722 B2 * | 2/2005 | Sasaki | G02B 6/2938 385/15 |
| 7,050,675 B2 | 5/2006 | Zhou | |
| 7,170,600 B2 | 1/2007 | Nishii et al. | |
| 7,182,528 B2 | 2/2007 | Mori | |
| 7,460,231 B2 | 12/2008 | Musa et al. | |
| 7,907,343 B2 | 3/2011 | Lee et al. | |
| 2003/0002789 A1 * | 1/2003 | Boye | G02B 6/2713 385/31 |
| 2004/0248331 A1 | 12/2004 | Cox et al. | |
| 2013/0058370 A1 * | 3/2013 | Chang-Hasnain | B82Y 20/00 372/50.11 |

FOREIGN PATENT DOCUMENTS

| | | | |
|---|---|---|---|
| JP | 2004226901 A * | 8/2004 | |
| JP | 2004226901 A | 8/2004 | |
| WO | WO-9419712 A1 | 9/1994 | |
| WO | WO-03058183 A1 | 7/2003 | |
| WO | WO-2010140998 A1 | 12/2010 | |
| WO | WO-2011081692 A2 | 7/2011 | |

OTHER PUBLICATIONS

International Search Report & Written Opinion received in PCT Application No. PCT/US2012/021066, Sep. 26, 2012, 10 pages.
Extended European Search Report received in EP Application No. 12864761.7, Aug. 21, 2015, 6 pages.
Bisaillon, E. et al., Distributed Subwavelength Grating Demultiplexer in SOI, (Research Paper), Proceedings of SPIE, the International Society for Optical Engineering, 2007, pp. 64750C-1-64750C-10, vol. 6475, No. 1.
International Search Report & Written Opinion, Sep. 26, 2012, PCT Patent Application No. PCT/US21012/021066, 10 pages.

* cited by examiner

INTEGRATED SUB-WAVELENGTH GRATING SYSTEM

BACKGROUND

Optical engines are commonly used to transfer electronic data at high rates of speed. An optical engine includes hardware for transferring an electrical signal to an optical signal, transmitting that optical signal, receiving the optical signal, and transforming that optical signal back into an electrical signal. The electrical signal is transformed into an optical signal when the electrical signal is used to modulate an optical source device such as a laser. The light from the source is then coupled into an optical transmission medium such as an optical fiber. After traversing an optical network through various optical transmission media and reaching its destination, the light is coupled into a receiving device such as a photo-detector. The photo-detector then produces an electrical signal based on the received optical signal for use by digital processing circuitry.

Circuitry that makes use of optical engines is often referred to as photonic circuitry. The various components that comprise a photonic circuit may include optical waveguides, optical amplifiers, lasers, and detectors. One common component used in photonic circuitry is a Vertical Cavity Surface Emitting Laser (VCSEL). Typically, multiple VCSELs are formed into a single chip and serve as light sources for optical transmission circuits. The light emitted by a VCSEL is typically focused into an optical transmission medium using a system of lenses.

This system of lenses may also act as either a multiplexer or demultiplexer. These components may be used for optical networks that utilize Wavelength Division Multiplexing (WDM) technology. WDM technology allows for transmission of several wavelengths of light through a single optical fiber. This provides several channels of communication across that single fiber and thus allows for a greater bandwidth. Bandwidth refers to the amount of data which can be transferred during a particular unit of time. In a WDM system, a multiplexer is used to divide a signal among multiple transmission mediums and a demultiplexer is used to combine multiple signals back into a single transmission medium.

BRIEF DESCRIPTION OF THE DRAWINGS

The accompanying drawings illustrate various examples of the principles described herein and are a part of the specification. The drawings are merely examples and do not limit the scope of the claims.

Throughout the drawings, identical reference numbers designate similar, but not necessarily identical, elements.

DETAILED DESCRIPTION

Figure 1:
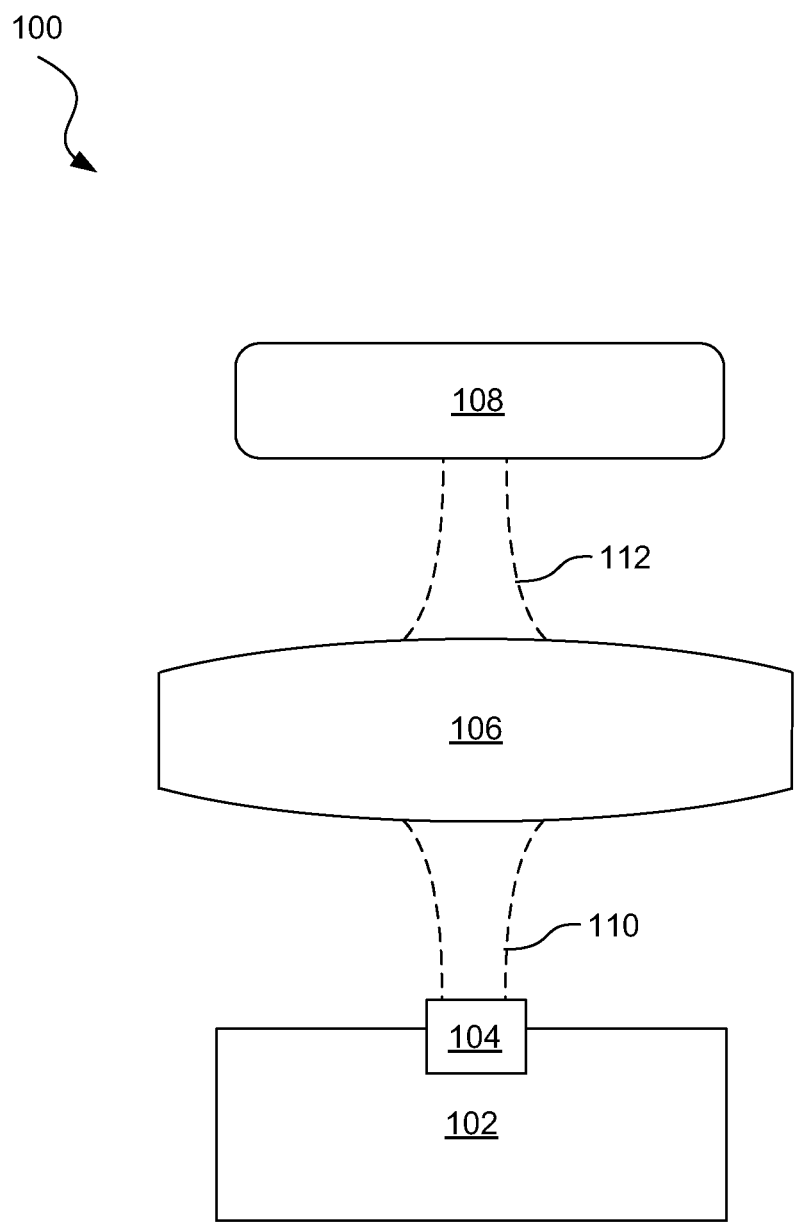
FIG. 1 is a diagram showing an illustrative optical system, according to one example of principles described herein.

As mentioned above, a system of lenses and other components such as gratings or prisms are typically used as a multiplexer to divide light according to wavelength. Additionally, the system of optical elements is used to combine signals of multiple wavelengths into a single optical transmission medium. Use of such optical systems consumes a relatively large amount of space. Additionally, fabrication of such lens systems is complicated, costly, and may take up a relatively large amount of space.

In light of this and other issues, the present specification discloses an integrated sub-wavelength grating system that can direct light between multiple optoelectronic components and a single point in a monolithic manner. An optoelectronic component refers to either a light source device such as a VCSEL or a light detection device such as a photo-detector.

According to certain illustrative examples, an integrated circuit chip includes a number of optoelectronic components formed into an optoelectronic substrate. A transparent layer is disposed directly on top of the optoelectronic substrate covering the optoelectronic components. A grating layer is formed on top of the transparent layer. Sub-wavelength grating elements are formed into the grating layer in alignment with active regions of optoelectronic components formed within the optoelectronic substrate. As will be described in more detail below, the patterning of these sub-wavelength grating elements are such that the grating elements act similar to lenses in that they are able to focus, collimate, or redirect a beam of light.

A second transparent layer is formed on top of the first grating layer. A second grating layer is then formed onto the second transparent layer. At least one diffraction grating is then formed into the second grating layer. A diffraction grating can be designed to split an incident beam of multiple wavelengths into multiple directions, light of different wavelengths propagating in different directions. The diffraction grating and the sub-wavelength gratings are designed such that light is coupled between the two types of gratings through the second transparent layer. In this manner, the two grating layers can act as an optical multiplexer or an optical demultiplexer. Optical multiplexing allows multiple data streams, each using a different wavelength of light, to propagate through a single optical transmission medium. Such optical transmission media may include, but is not limited to, glass fibers or polymer waveguides. Propagating multiple wavelengths of light through a single medium significantly multiplies the data capacity of the medium.

In the case that the optoelectronic elements are source devices such as VCSELs, then the sub-wavelength grating elements formed within the first grating layer are designed to collimate and redirect an incident beam through the second transparent layer towards the diffraction grating formed within the second grating layer. The diffraction grating is designed to receive light from that particular angle and at that particular frequency and direct that light in a specific direction outside the grating system. The diffraction grating lens is designed to receive beams of light of different wavelengths from multiple sub-wavelength grating elements and direct each of those beams in a single direction. In this manner, the grating system acts as an optical multiplexer by combining light of multiple wavelengths into a single optical transmission medium.

In the case that the optoelectronic elements are light detection devices, then the diffraction grating of the second grating layer is designed to split an incident beam into a discrete number of beams and simultaneously redirect each beam toward a specific location in the structure. The positioning of the diffraction grating and the sub-wavelength gratings of the first grating layer are such that the beams from the diffraction grating are directed towards those sub-wavelength gratings. The patterning of the sub-wavelength gratings is such that they will focus light received from the diffraction grating towards the light detection optoelectronic components within the substrate. In this manner, the grating system acts as a demultiplexer by receiving light of different wavelengths propagating through a single optical transmission medium and dividing that light into multiple beams of different wavelengths.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an example" or similar language means that a particular feature, structure, or characteristic described in connection with that example is included as described, but may not be included in other examples.

Referring now to the figures, FIG. 1 is a diagram illustrating an optical system (100). According to certain illustrative examples, the optical system (100) includes an optoelectronic component (102). The optoelectronic component may be either a source device such as a VCSEL or a light receiving device such as a photo-detector. The active region (104) of the optoelectronic component (102) is the part that actually emits or detects light. A lens system (106) is typically used to couple light (110, 112) between the optoelectronic component (102) and an optical transmission medium (108).

For example, in the case that the optoelectronic component is a VCSEL, the active region (104) projects light (110) into the lens system (106). The lens system (106) may include a number of lenses which are designed to affect light in a predetermined manner. Specifically, the lens system (106) focuses the light (112) into the optical transmission medium (108) based on a variety of factors including the curvature of the lenses within the system, the distances between the lenses, and the nature of the optoelectronic component (102) itself. Use of the lens system (106) involves precise placement of the lens system between the optoelectronic component (102) and the optical transmission medium (108). This precision complicates the manufacturing process and thus adds to the cost.

In light of this issue, the present specification discloses methods and systems for manufacturing layers of optical elements that can be integrated directly onto a chip in a monolithic manner. Thus, the chip itself includes the optical elements that are used to focus, multiplex, or demultiplex light according to the design purposes of the chip. Throughout this specification and in the appended claims, the term "sub-wavelength grating element" is to be interpreted as an optical element wherein the size of the grating features are less than the wavelength of light to pass through the grating element.

Figure 2:
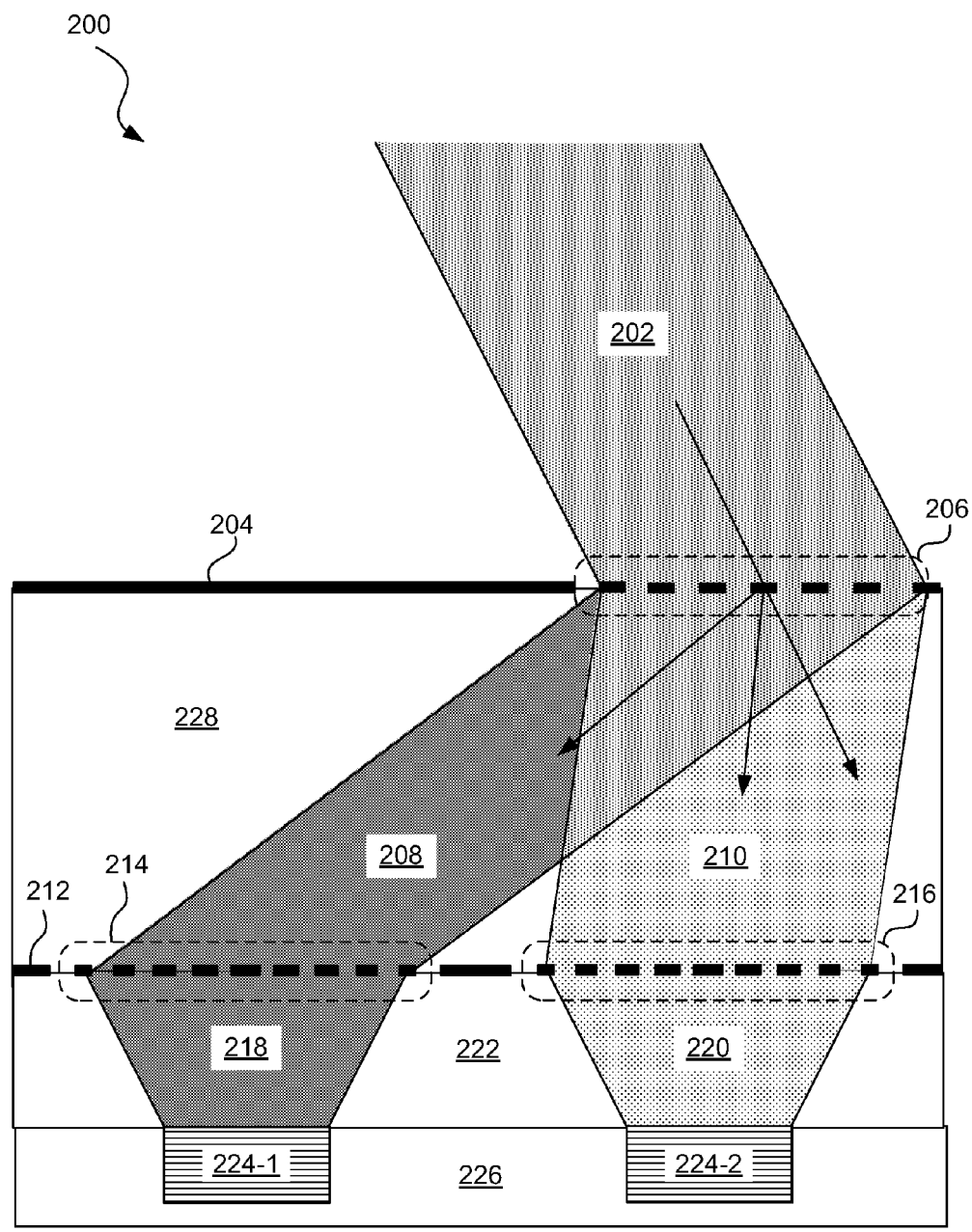
FIG. 2 is a diagram showing an illustrative integrated sub-wavelength grating system, according to one example of principles described herein.

FIG. 2 is a diagram showing an illustrative integrated sub-wavelength grating system (200). According to certain illustrative examples, a number of optoelectronic components (224) are formed within an optoelectronic substrate (226). An optoelectronic substrate refers to a chip in which optoelectronic components are formed. A first transparent layer (222) is formed on top of the optoelectronic substrate layer (226) and the optoelectronic components (224) formed therein. A first grating layer (212) is formed on top of the first transparent layer (222). The first grating layer includes a number of sub-wavelength grating elements (214, 216) formed in alignment with the active regions of the optoelectronic components (224). A second transparent layer (228) is formed on top of the first grating layer (212). A second grating layer (204) is formed on top of the second transparent layer (228). A diffraction grating element (206) is formed into that second grating layer (204).

The optoelectronic substrate (226) may be a standard semiconductor material used in standard integrated circuit manufacturing processes. The transparent layers (222, 228) may be made of any material that allows the propagation of electromagnetic radiation at optical frequencies through the material. For example, the transparent layers (222, 228) may be made of an oxide material.

In the example shown in FIG. 2, the optoelectronic components (224) are light detection devices. Thus, the grating system is acting as a demultiplexer. According to certain illustrative examples, a beam of light (202) is incident upon the diffraction grating (206). This beam of light (202) may include light of multiple wavelengths. When that beam of light impinges on the diffraction grating element (206), it will be separated according to wavelength on the other side of the diffraction grating element (206).

A diffraction grating includes a number of periodic openings in an opaque material. Light is thus allowed to pass through the diffraction grating only at those openings. Each of those openings essentially acts as a point source on the side opposite of the side on which the light impinges. The wavefront of the light at any point on the output side of the diffraction grating is a combination of the light passing through each of the openings. These waves will interact constructively and destructively in a manner such that certain directions will be at a maximum intensity due to the summation of the light from each of the openings. The equation that describes which angles will essentially propagate beams of light is as follows:

$$d(\sin(T_m)-\sin(T_i))=m\lambda \quad \text{(Equation 1)}$$

where:
d=diameter of the openings of the diffraction grating
$T_m$=the angles at which light is at a maxima
$T_i$=the angle at which light is incident upon the diffraction grating
m=an integer number; and
λ=the wavelength of incident light.

As can be noted from the above equation, different wavelengths will have maxima at different angles from the diffraction grating element. Thus, if an incident beam of light (202) which includes light of multiple wavelengths is incident upon the diffraction grating element (206), then the different wavelengths of light will be directed at different angles on the other side of the diffraction grating element (206). In this example, the beam of light includes two wavelengths of light. As the beam of light (202) passes through the diffraction grating element (206), a first beam of light (208) of one wavelength propagates through the second transparent layer (228) at one angle while a second beam of light (210) of a different wavelength propagates through the second transparent layer (228) at a different angle.

The placement of the diffraction grating (206) relative to the sub-wavelength gratings (216) is such that the beams of light (208, 210) will be directed towards those sub-wavelength gratings (214, 216) based on the known wavelengths of those beams. Additionally, based on the known wavelength of the beams to be incident upon the sub-wavelength gratings, the sub-wavelength gratings can be designed to redirect light from the appropriate angle directly towards the light detection optical components (224).

For example the first sub-wavelength grating (214) may be designed to direct light coming from a specific angle towards the optoelectronic component (224-1). Specifically, as the light beam (208) passes through the sub-wavelength grating (214), it will become a focused beam (218) aimed at the active region of the light detection optoelectronic component (224-1). Likewise, the beam of light (210) that passes through the other sub-wavelength grating (216) will become a focused beam (220) directed towards the active region of the other light detection optoelectronic component (224-2). In this manner, the different optoelectronic components (224) may work with different data streams that can be propagated simultaneously through the same optical transmission medium.

Figure 3:
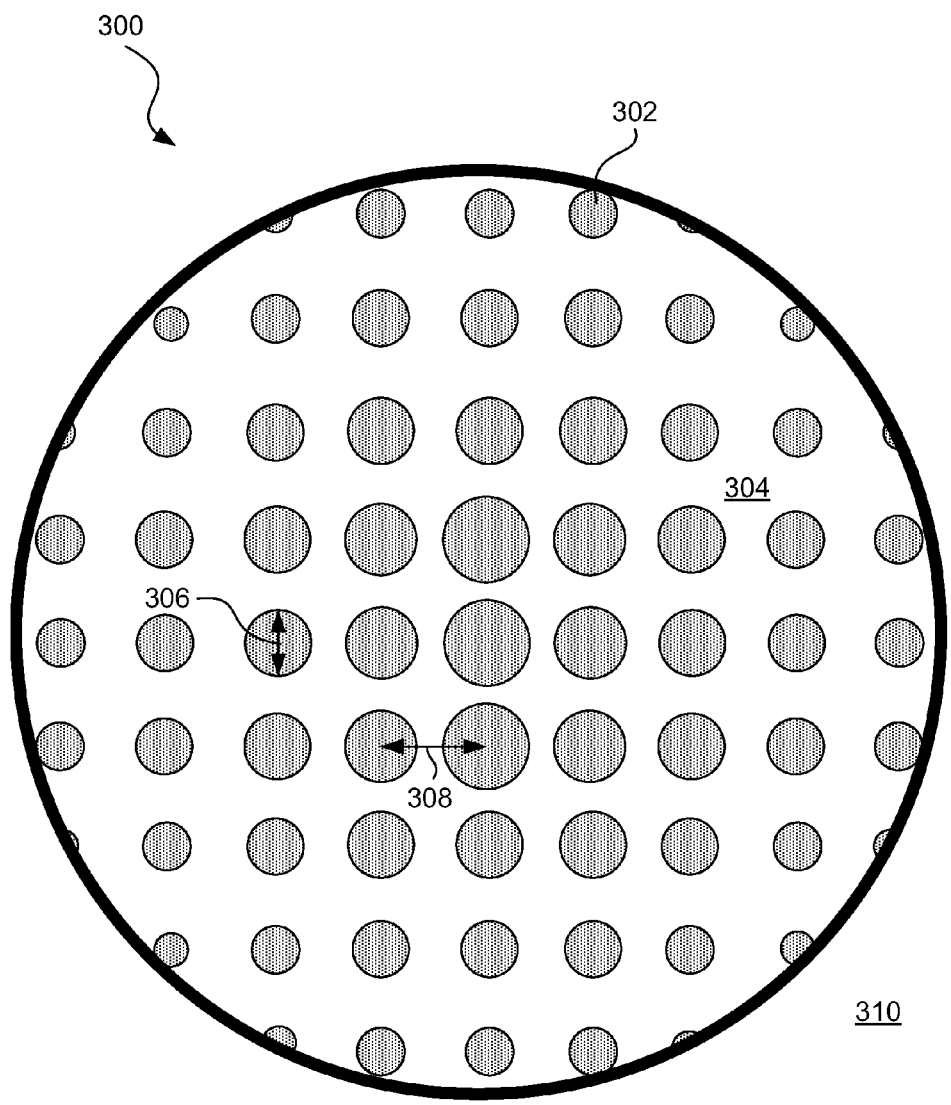
FIG. 3 is a diagram showing an illustrative top view of a sub-wavelength grating system, according to one example of principles described herein.

FIG. 3 is a diagram showing an illustrative top view of a sub-wavelength grating element (300). Such sub-wavelength grating elements may be used as described above (e.g. 214, 216, FIG. 2). According to certain illustrative examples, the sub-wavelength grating element (300) is a two dimensional pattern formed into the grating layer (310). The grating layer (310) may be composed of a single elemental semiconductor such as silicon or germanium. Alternatively, the grating layer may be made of a compound semiconductor such as a III-V semiconductor. The Roman numerals III and V represent elements in the IIIa and Va columns of the Periodic Table of the Elements.

As mentioned above, the grating layer (310) is formed on top of the transparent layer. The grating layer (310) material can be selected so that it has a higher refractive index than the underlying transparent layer. Due to this relatively high difference in refractive index between the grating layer and the transparent layer, the sub-wavelength grating element can be referred to as a high-contrast sub-wavelength grating element.

The grating patterns can be formed into the grating layer (310) to form the sub-wavelength grating elements using Complementary Metal Oxide Semiconductor (CMOS) compatible techniques. For example, a sub-wavelength grating element (300) can be fabricated by depositing the grating layer (310) on a planar surface of the transparent layer using wafer bonding or chemical or physical vapor deposition. Photolithography techniques may then be used to remove portions of the grating layer (310) to expose the transparent layer (304) underneath. Removing portions of the grating layer (310) will leave a number of grating features (302). In the example of FIG. 3, the grating features (302) are posts. However, in some cases, the grating features may be grooves.

The distance between the centers of the grating features (302) is referred to as the lattice constant (308). The lattice constant (308) is selected so that the sub-wavelength grating element does not scatter light in an unwanted manner. Unwanted scattering can be prevented by selecting the lattice constant appropriately. The sub-wavelength grating may also be non-periodic. That is, the parameters of the grating features such as the diameter of the posts or the width of the grooves may vary across the area of the sub-wavelength grating element (300). Both the dimensions (306) of the grating features (302) and the length of the lattice constant (308) are less than the wavelength of light produced by the VCSELs that travels through the sub-wavelength grating element.

The lattice constant (308) and grating feature parameters can be selected so that the sub-wavelength grating element (300) can be made to perform a specific function. For example, the sub-wavelength grating element (300) may be designed to focus light in a particular manner. Alternatively, the sub-wavelength grating element (300) may be designed to collimate light. Additionally, the sub-wavelength grating element may tilt the collimated beam at a specific angle. In some cases, the sub-wavelength grating element may split or bend a beam of light. More detail about methods for designing such sub-wavelength grating elements for specific functions can be found at, for example, US Patent Publication No. 2011/0261856, published on Oct. 27, 2011.

Figure 4:
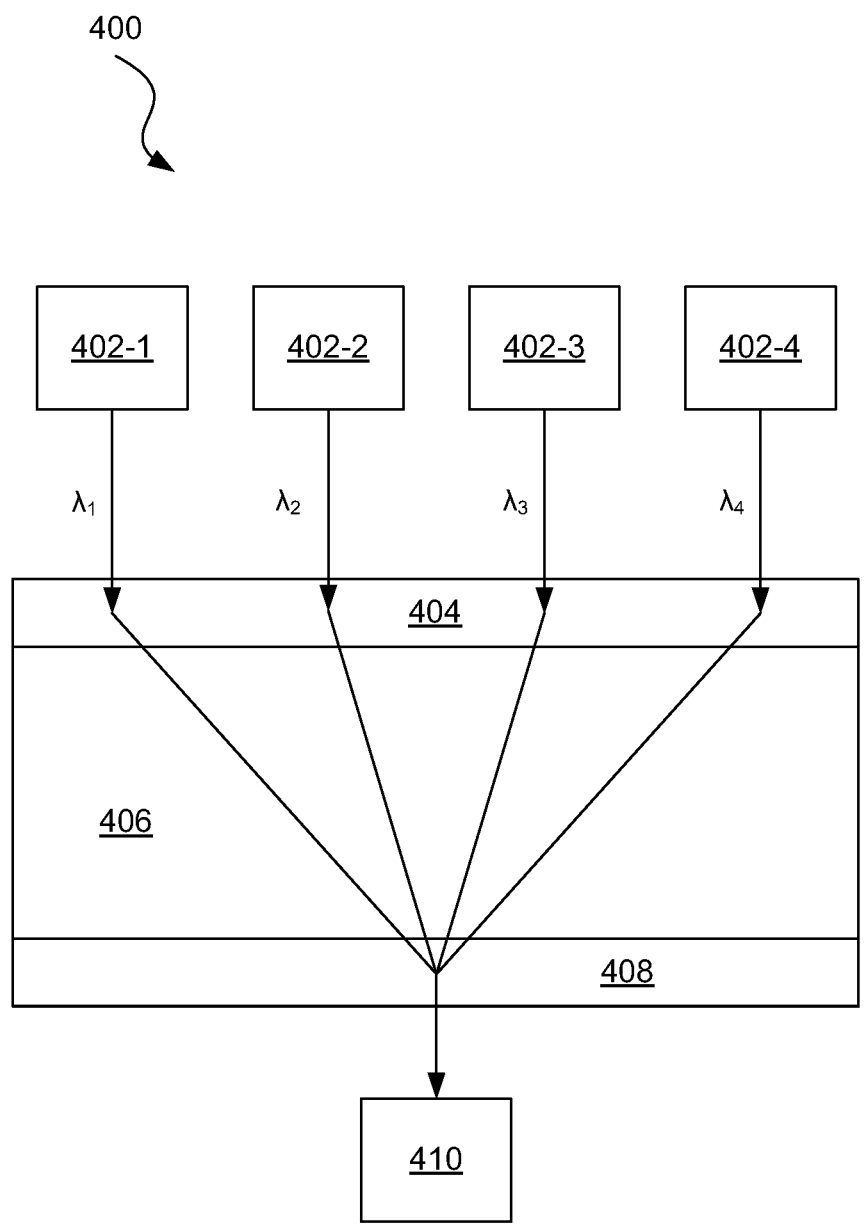
FIG. 4 is a diagram showing an illustrative integrated sub-wavelength grating system used as a multiplexer, according to one example of principles described herein.

FIG. 4 is a diagram showing an illustrative integrated sub-wavelength grating system used as a multiplexer (400). As mentioned above, an optical multiplexer is used to combine different optical signals of different wavelength into the same optical transmission medium so that those signals can propagate simultaneously though the medium.

According to certain illustrative examples, multiple optical sources (402) such as VCSELs are designed to project light of different wavelengths. The beams of light from those VCSELs (402) are projected toward an array (404) of sub-wavelength gratings. Each sub-wavelength grating within that array is specifically aligned and designed to direct the light from the corresponding VCSEL through a transparent medium (406) towards a single point. At that single point, a diffraction grating from an array (408) of diffraction gratings will collect that light and direct it towards an optical transmission medium (410).

Figure 5:
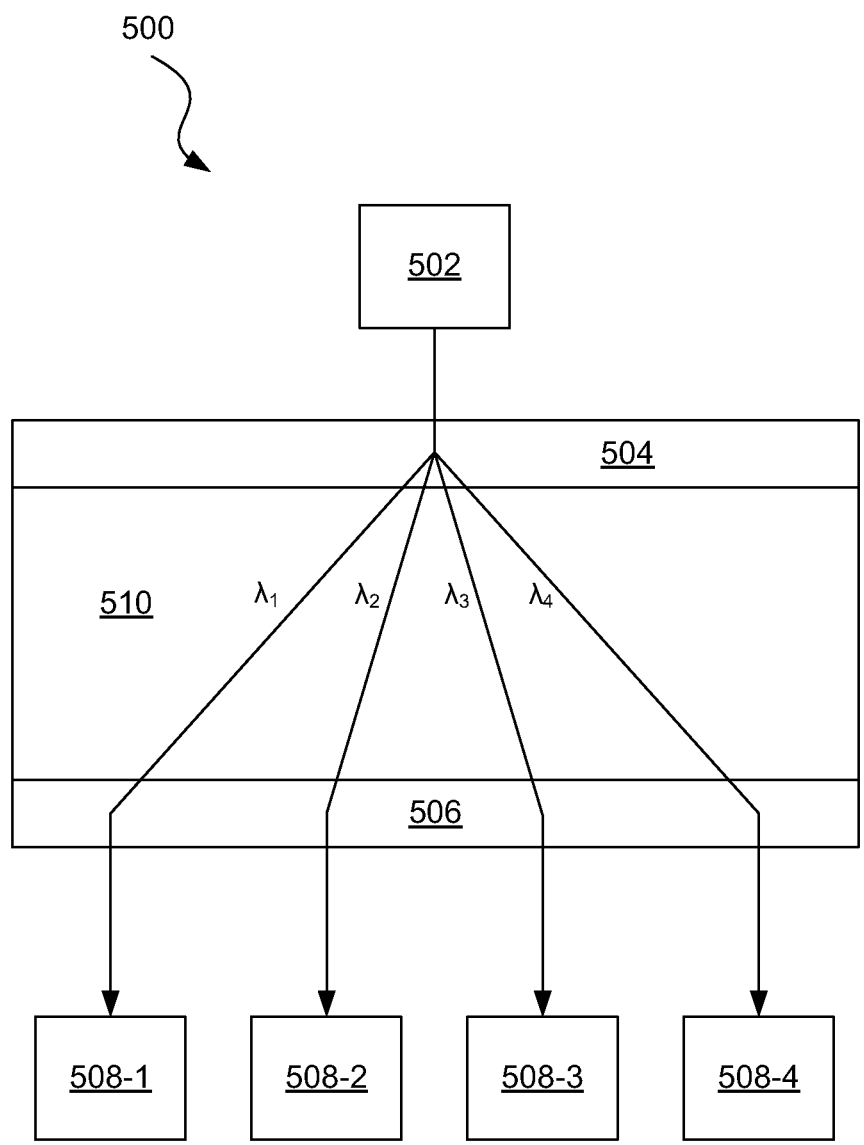
FIG. 5 is a diagram showing an illustrative integrated sub-wavelength grating system used as a demultiplexer, according to one example of principles described herein.

FIG. 5 is a diagram showing an illustrative integrated sub-wavelength grating system used as a demultiplexer (500). As mentioned above, an optical demultiplexer divides a beam of light according to wavelength. Thus, beams of light having different wavelength that were combined into a single optical transmission medium can then be separated for further processing.

According to certain illustrative examples, as the beam of multiple-wavelength light comes out of an optical transmission medium (502) it is projected toward a diffraction grating (504). That diffraction grating is designed to divide the light according to wavelength. After propagating through a transparent medium (510), each separate beam of light reaches a sub-wavelength grating element of an array (506) of sub-wavelength grating elements. Those sub-wavelength grating elements then focus their respective beams of light towards an array of optoelectronic detector devices (508).

In some cases, the multiple wavelengths of light may be of a relative small difference. Thus, the difference in angle for each beam of light when passing through the diffracted grating may be relatively small. In order for the beams to be separated enough so that they are projected toward different optical elements, the transparent layer between the diffraction grating elements and the sub-wavelength grating elements may be relatively thick. However, due to the common objective of designing circuits and chips to take up the smallest amount of space possible, this thickness may be undesirable. The following describes a method for using a relatively thin transparent layer even when the difference in wavelength between the discrete beams yields a relatively small angular spread.

Figure 6:
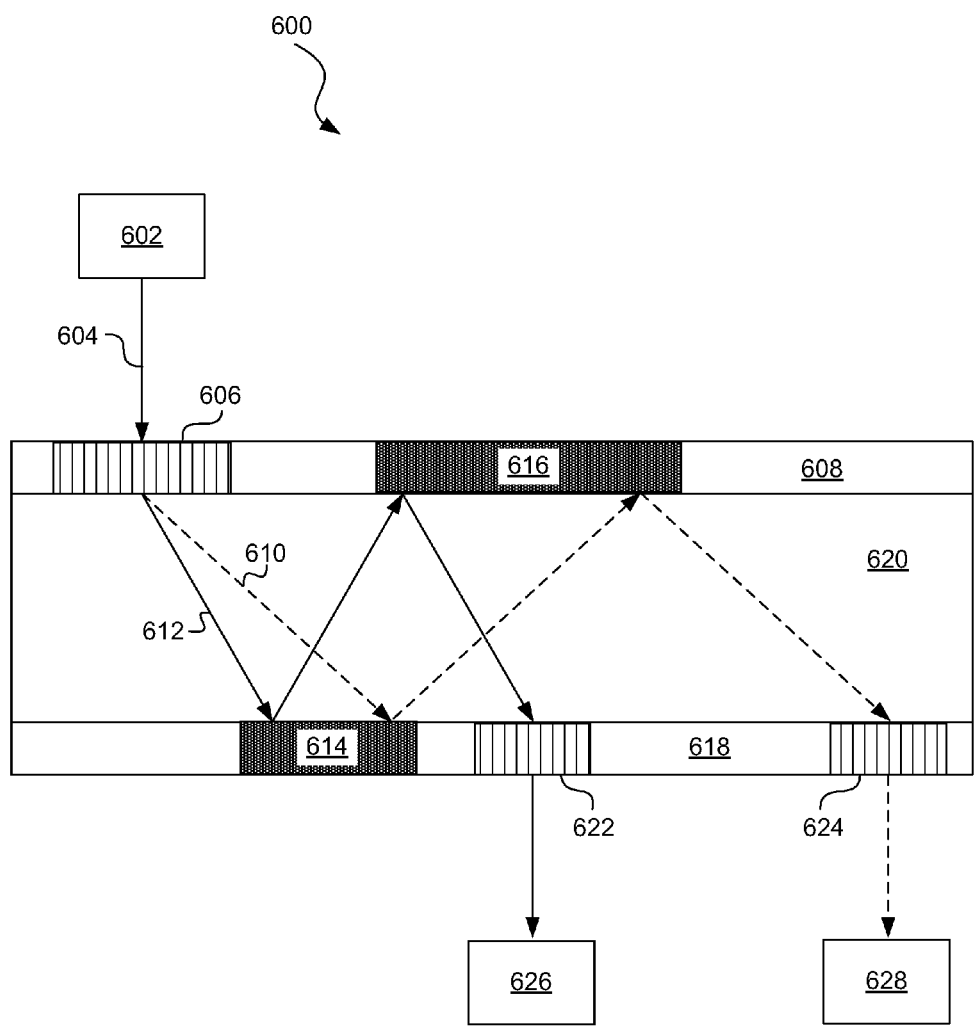
FIG. 6 is a diagram showing an illustrative integrated sub-wavelength grating system with a thin transparent layer and reflective surfaces used to increase angular spread, according to one example of principles described herein.

FIG. 6 is a diagram showing an illustrative integrated sub-wavelength grating system (600) with a thin transparent layer and reflective surfaces used to increase angular spread. According to certain illustrative examples, a multi-wavelength beam of light (604) is projected from an optical transmission medium (602) to a diffraction grating element (606) formed within a second grating layer (608). The diffraction grating element (606) causes the multi-wavelength beam of light to be split according to wavelength. In this example, the split results in two beams of light (610, 612) of different wavelengths.

Due to the relatively thin nature of the transparent layer (620), the two beams (610, 612) are not spread far enough apart by the time they reach the first grating layer (618). Thus, a reflective element (614) is formed within the first grating layer (618) to reflect those beams of light back through the transparent layer (620). Additionally, another reflective element (616) is formed within the second grating layer (608) to bounce the light beams back through the transparent layer (620) towards the first grating layer (618).

Light is reflected from a reflective surface at the same angle at which it is incident. Thus, the angular spread will remain constant as the light bounces back and forth through the transparent layer (620). In some examples, the light beams (610, 612) may bounce back and forth several times before reaching the sub-wavelength grating elements (622, 624) formed within the first grating layer (618).

Upon reaching the sub-wavelength grating elements (622, 624) each beam of light will be properly redirected and focused toward a corresponding optoelectronic component. For example, the first sub-wavelength grating (622) is designed to direct light from the angle at which the first beam (612) is received toward a first optoelectronic component (626). Likewise, the second sub-wavelength grating (624) is designed to direct light from the angle at which the second beam (610) is received toward a second optoelectronic component (628).

Various materials may be used to form the reflective elements. In some cases, portions of the grating layer may be etched away and filled with a reflective layer. In some cases, a reflective substance may be disposed on the transparent layer before the grating layer is disposed. In some cases, no specific reflective elements are formed. Rather, the light bounces based on total internal reflection. Total internal reflection refers to the process whereby light strikes a medium boundary at an angle larger than a particular critical angle with respect to a vector normal to the surface. If the refractive index is lower on the other side of the boundary and the incident angle is greater than the critical angle, then all light will be reflected. In this case, if the material outside the boundary of the transparent layer has a lower refractive index than the transparent material, then light will be internally reflected as long as the incident angle is larger than the critical angle.

Figure 7:
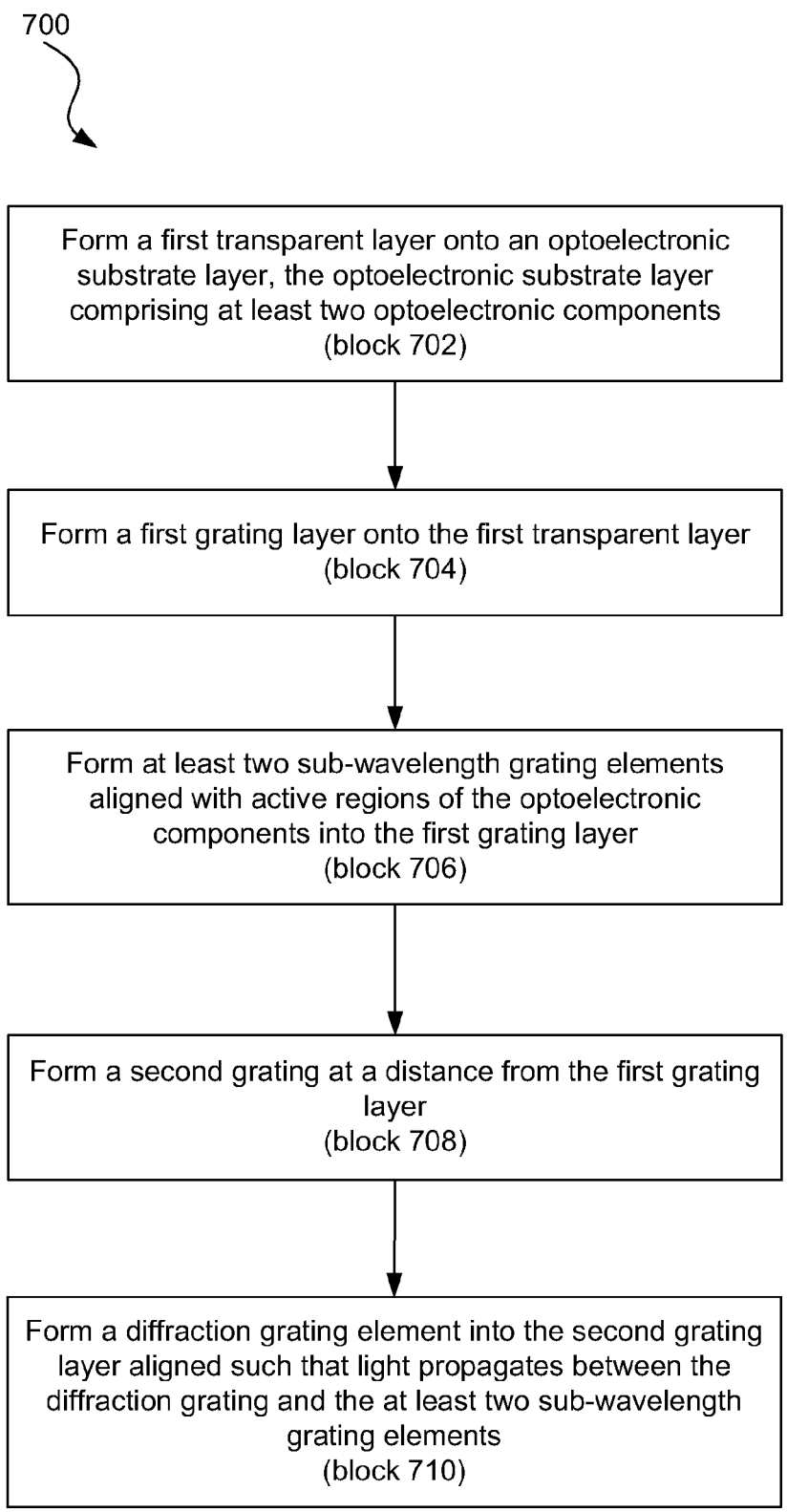
FIG. 7 is a flowchart showing an illustrative method for forming an integrated sub-wavelength grating system, according to one example of principles described herein.

FIG. 7 is a flowchart (700) showing an illustrative method for forming an integrated sub-wavelength grating system. According to certain illustrative examples, the method includes forming (block 702) a first transparent layer onto an optoelectronic substrate layer, the optoelectronic substrate layer comprising at least two optoelectronic components, forming (block 704) a first grating layer onto the first transparent layer, forming (block 706) at least two sub-wavelength grating elements aligned with active regions of the optoelectronic components in the first grating layer, forming (block 708) a second grating at a distance from the first grating layer, and forming (block 710) a diffraction grating element into the second grating layer aligned such that light propagates between the diffraction grating and the at least two sub-wavelength grating elements.

In conclusion, through use of systems and methods embodying principles described herein, multiplexing and demultiplexing systems can be formed onto an integrated chip in a monolithic manner. Thus, no use of complicated lens systems and alignment processes are used. Such systems allow for less costly and more compact optical transmission systems.

The preceding description has been presented only to illustrate and describe examples of the principles described. This description is not intended to be exhaustive or to limit these principles to any precise form disclosed. Many modifications and variations are possible in light of the above teaching.

What is claimed is:

1. An integrated grating element system comprising:
a first transparent layer formed on an optoelectronic substrate layer, said optoelectronic substrate layer comprising at least two optoelectronic components;
a first grating layer disposed on said first transparent layer and having a higher refractive index than the first transparent layer, said grating layer comprising at least two sub-wavelength grating elements formed therein aligned with active regions of said optoelectronic components, wherein the at least two sub-wavelength grating elements each focus, collimate, or bend a beam of light, and wherein the at least two sub-wavelength grating elements form a high contrast subwavelength grating having a pattern that varies in at least two dimensions; and
a second grating layer at a distance from said first grating layer such that light propagates between a diffraction grating element formed within said second grating layer and said at least two sub-wavelength grating elements,
wherein the at least two optoelectronic components comprise optical sources and the system functions as a multiplexer, or the at least two optoelectronic components comprise optical detectors and the system functions as a demultiplexer.

2. The system of claim 1, wherein said distance between said first grating layer and said second grating layer comprises a second transparent layer.

3. The system of claim 1, further comprising, reflective surfaces positioned to bounce light between said first grating layer and said second grating layer between said diffraction grating element and said sub-wavelength grating elements.

4. The system of claim 1, wherein said at least two optoelectronic components comprise optical sources to project light of different wavelengths into said sub-wavelength grating elements.

5. The system of claim 4, wherein said sub-wavelength grating elements are to collimate and angle light projected from said optical sources towards said diffraction grating element formed within said second grating layer.

6. The system of claim 1, wherein said at least two optoelectronic components comprise optical detector devices to receive light of different wavelengths from said sub-wavelength grating elements.

7. The system of claim 6, wherein said diffraction grating element is to split incident light into multiple directions according to wavelength, said directions pointing towards said sub-wavelength grating elements.

8. The system of claim 1, wherein said sub-wavelength grating elements comprise two-dimensional, non-periodic variations of grating feature parameters to affect light in a predetermined manner.

9. A method for forming an integrated sub-wavelength grating system, the method comprising:
   forming a first transparent layer on an optoelectronic substrate layer, said optoelectronic substrate layer comprising at least two optoelectronic components;
   forming a first grating layer on said first transparent layer having a higher refractive index than the first transparent layer;
   forming at least two sub-wavelength grating elements aligned with active regions of said optoelectronic components in said first grating layer, wherein the at least two sub-wavelength grating elements each focus, collimate, or bend a beam of light, and wherein the at least two sub-wavelength grating elements form a high contrast subwavelength grating having a pattern that varies in at least two dimensions;
   forming a second grating at a distance from said first grating layer; and
   forming a diffraction grating element in said second grating layer aligned such that light propagates between said diffraction grating and said at least two sub-wavelength grating elements.

10. The method of claim 9, further comprising reflecting light between said first grating layer and said second grating layer between said diffraction grating element and said sub-wavelength grating elements.

11. The method of claim 9, wherein said at least two optoelectronic components comprise optical sources to project light of different wavelengths into said sub-wavelength grating elements.

12. The method of claim 11, further comprising, with said sub-wavelength grating elements, collimating and tilting light from said optical sources to said diffraction grating element.

13. The method of claim 9, wherein said at least two optoelectronic components comprise optical detector devices to receive light of different wavelengths from said sub-wavelength grating elements.

14. The method of claim 13, further comprising, with said diffraction grating element, splitting incident light into multiple directions according to wavelength, said directions pointing towards said sub-wavelength grating elements.

15. An integrated sub-wavelength grating element system comprising:
   an integrated circuit chip comprising:
      a first transparent layer formed on an optoelectronic substrate layer, said optoelectronic substrate layer comprising an array of optoelectronic components;
      a first grating layer disposed on said first transparent layer and having a higher refractive index than the first transparent layer, said grating layer comprising an array of two sub-wavelength grating elements formed therein aligned with active regions of said optoelectronic components, wherein the at least two sub-wavelength grating elements each focus, collimate, or bend a beam of light, and wherein the at least two sub-wavelength grating elements form a high contrast subwavelength grating having a pattern that varies in at least two dimensions;
      a second transparent layer formed on said first grating layer; and
      a second grating layer formed on said second transparent layer, said second grating layer comprising an array of diffraction grating elements, each diffraction grating element configured to couple light between at least two of said sub-wavelength grating elements at different wavelengths,
   wherein the at least two optoelectronic components comprise optical sources and the system functions as a multiplexer, or the at least two optoelectronic components comprise optical detectors and the system functions as a demultiplexer.

\* \* \* \* \*